United States Patent [19]

O'Donnelly et al.

[11] Patent Number: 5,315,155

[45] Date of Patent: May 24, 1994

[54] ELECTRONIC PACKAGE WITH STRESS RELIEF CHANNEL

[75] Inventors: Brian E. O'Donnelly, Branford; Brian Mravic, North Haven; Jacob Crane, Woodbridge; Deepak Mahulikar, Madison, all of Conn.

[73] Assignee: Olin Corporation, New Haven, Conn.

[21] Appl. No.: 912,535

[22] Filed: Jul. 13, 1992

[51] Int. Cl.$^5$ .................... H01L 23/02; H01L 23/12
[52] U.S. Cl. .................... 257/711; 257/706
[58] Field of Search ............... 257/711, 706, 707, 708, 257/710, 731, 732, 733, 709

[56] References Cited

U.S. PATENT DOCUMENTS

| | | |
|---|---|---|
| 4,149,910 | 4/1979 | Popplewell . |
| 4,185,139 | 1/1980 | Smernos . |
| 4,202,700 | 5/1980 | Wilder, Jr. . |
| 4,451,540 | 5/1984 | Baird et al. . |
| 4,491,622 | 1/1985 | Butt . |
| 4,532,222 | 7/1985 | Butt . |
| 4,656,499 | 4/1987 | Butt . |
| 4,704,626 | 11/1987 | Mahulikar et al. . |
| 4,715,892 | 12/1987 | Mahulikar . |
| 4,752,521 | 6/1988 | Smith, III et al. . |
| 4,756,754 | 7/1988 | SinghDeo . |
| 4,761,518 | 8/1988 | Butt et al. . |
| 4,769,345 | 9/1988 | Butt et al. . |
| 4,784,974 | 11/1988 | Butt . |
| 4,796,083 | 1/1989 | Cherukuri et al. . |
| 4,805,009 | 2/1989 | Pryor et al. . |
| 4,839,716 | 6/1989 | Butt . |
| 4,872,047 | 10/1989 | Fister et al. . |
| 4,882,212 | 11/1989 | SinghDeo et al. ............... 428/76 |
| 4,952,531 | 8/1990 | Cherukuri . |
| 4,961,106 | 10/1990 | Butt et al. . |
| 4,978,052 | 12/1990 | Fister et al. . |
| 5,012,386 | 4/1991 | McShane et al. . |
| 5,015,803 | 5/1991 | Mahulikar et al. . |
| 5,023,398 | 6/1991 | Mahulikar . |
| 5,047,371 | 9/1991 | Cherukuri . |
| 5,066,368 | 11/1991 | Pasqualoni et al. . |
| 5,099,310 | 3/1992 | Osada et al. . |

FOREIGN PATENT DOCUMENTS 357192050 11/1982 Japan .
364025443 1/1989 Japan .

*Primary Examiner*—Rolf Hille
*Assistant Examiner*—S. V. Clark
*Attorney, Agent, or Firm*—Gregory S. Rosenblatt

[57] ABSTRACT

There is provided an electronic package assembly having a leadframe and buffer bonded to a metallic base. To reduce the stress generated by the coefficient of thermal expansion mismatch, the buffer is mounted on a pedestal. The cross sectional area of the pedestal is less than that of the buffer, such that the at least a portion of the buffer overhangs the pedestal.

12 Claims, 1 Drawing Sheet

ELECTRONIC PACKAGE WITH STRESS RELIEF CHANNEL

CROSS-REFERENCE TO RELATED APPLICATION

This patent application relates to U.S. patent application Ser. No. 07/912,456 entitled "Electronic Package Having Controlled Epoxy Flow" by Paul R. Hoffman et al, filed on even date and assigned to a common assignee.

BACKGROUND OF THE INVENTION

This invention relates generally to a glass sealed metal electronic package. More particularly, fracture of the sealing glass is reduced by supporting a buffer disposed between the package base and semiconductor device on a pedestal.

DESCRIPTION OF RELATED ART

Glass sealed electronic packages are used to encase integrated circuits such as silicon based semiconductor devices. One such package is the CERDIP (ceramic dual in line). The CERDIP has a ceramic, usually alumina ($Al_2O_3$), base and cover. A leadframe is disposed between the base and cover with a semiconductor device electrically interconnected thereto by small diameter bond wires. A sealing glass having a coefficient of thermal expansion matching that of the base and cover bonds both to the leadframe, encapsulating the integrated circuit device. The CERDIP package provides a hermetic enclosure which protects the integrated circuit device from moisture and other contaminants, as well as from mechanical shock. However, the alumina package components are poor conductors of heat. Heat generated by the electronic device is not readily removed shortening the operating life of the device.

To improve the conduction of heat, glass sealed metal packages have been developed. These packages have a metallic base and cover bonded together with a sealing glass. A leadframe is disposed between the base and cover components are manufactured from a metal having high thermal conductivity such as copper or a copper based alloy as disclosed in U.S. Pat. No. 4,656,499 to Butt or aluminum or an aluminum based alloy as disclosed in U.S. Pat. No. 5,023,398 to Mahulikar et al.

The metallic components have a coefficient of thermal expansion considerably higher than that of alumina and different sealing glasses are required. High thermal expansion glasses suitable for bonding to copper based package components include a vitreous glass matrix having up to 30 weight percent of an uncoated particulate additive to increase the coefficient of thermal expansion such as calcium fluoride or barium fluoride as disclosed in U.S. Pat. No. 4,752,521 to Smith, III et al. Another suitable glass consists essentially of at least 50 molar percent silicon dioxide, 12–15 molar percent barium oxide, 20–30 molar percent of an alkaline oxide component comprised of at least two alkali oxides selected from the group consisting of sodium oxide, potassium oxide and lithium oxide and from about 0.5 to about 5 molar percent of alumina as disclosed in U.S. Pat. No. 4,952,531 to Cherukuri.

The high thermal expansion of the metallic base also makes bonding of the semiconductor device more difficult. The silicon based semiconductor device has a relatively low coefficient of thermal expansion, about $60 \times 10^{-7}/°$ C. Direct bonding of the semiconductor device to the metallic base will result in fracture of the device due to stresses generated during thermal cycling by the coefficient of thermal expansion mismatch. To minimize fracture of the device, a buffer is disposed between the base and device as disclosed in U.S. Pat. No. 4,872,047 to Fister et al. The buffer has a coefficient of thermal expansion close to that of the silicon based device. Buffers known in the art include molybdenum, tungsten and composite materials such as copper clad stainless steel.

While the buffer minimizes cracking of the semiconductor device, the edges of the buffer form stress concentration points. Fracture of the sealing glass frequently initiates at the stress concentration Points. Several solutions to minimize this stress have been proposed, including reducing the size of the buffer. This solution is unacceptable because the buffer has to be at least as large as the semiconductor device.

A second solution is to reduce the thickness of the buffer. However, to eliminate the concentration of stresses at the edges of the buffer, a buffer thickness of under about 0.25 millimeters (0.01 inches) is required. When the buffer becomes this thin, the effectiveness of minimizing strains on the integrated circuit device is reduced.

SUMMARY OF THE INVENTION

Accordingly, it is object of the invention to provide a base for a glass sealed metal electronic package which reduces fracture of a sealing glass. It is a feature of the invention that a buffer is disposed between the package base and an integrated circuit device. The buffer is supported on a pedestal and a portion of the buffer overhangs the edges of the pedestal. Yet another feature of the invention is that the pedestal is defined by a continuous channel machined into the base.

It is an advantage of the invention that the pedestal reduces the area of the braze bonding the pedestal to the buffer. Yet another advantage of the invention is that the continuous channel affords strain relief through plastic deformation of the thin region of the base. The combination of the two aforestated advantages is that stress on the sealing glass is reduced, minimizing cracking.

In accordance with the invention, there is provided an electronic package assembly. The package assembly has a leadframe with a plurality of leads, the inner ends of which define a central region. A base component is bonded to the leadframe with a sealing glass. The base contains a pedestal which is adjacent to the central region defined by the inner lead ends. A buffer is bonded to the die attach pedestal with a metallic braze, solder or a sealing glass and overhangs at least a portion of the pedestal.

The above stated objects, features and advantages will become more clear from the specification and drawings which follow.

DESCRIPTION OF THE INVENTION

Figure 1:
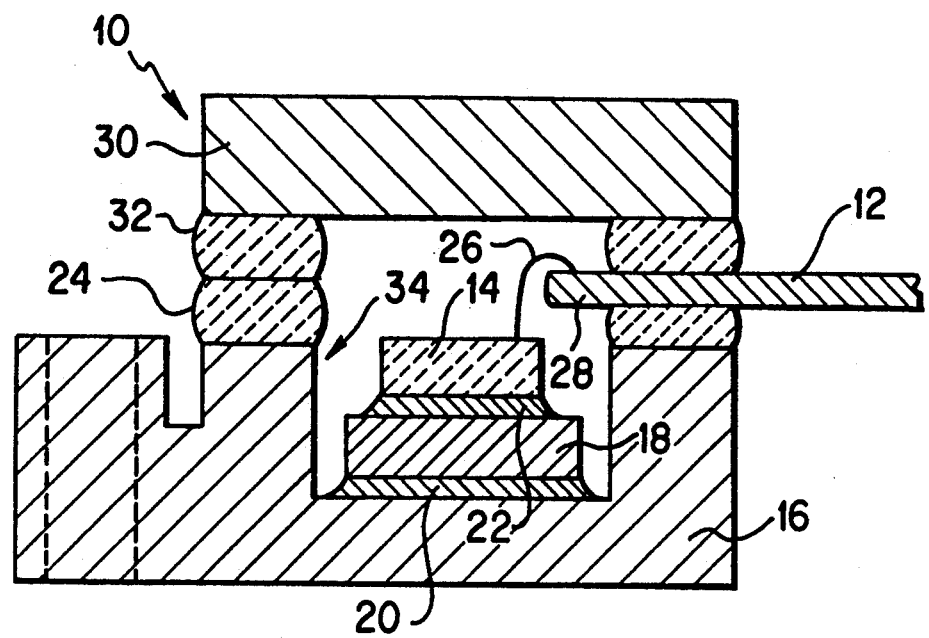
FIG. 1 shows in cross sectional representation a glass-sealed metal electronic package as known in the art.

FIG. 1 shows in cross sectional representation a glass sealed metal package 10 as known from the prior art. The package 10 is a SIP (single in line package) having a leadframe 12 approaching the integrated circuit device 14 from one side. A SIP package is frequently used to encase low lead count, high power devices, such as transistors. However, the concepts of the invention are not limited to SIP packages, DIP (dual in line) packages in which the leads approach the device from two opposing sides and quad packages in which the leads approach the device from four sides are benefited as are pin grid array packages.

The package 10 has a metallic base 16 preferably formed from copper, aluminum or an alloy of copper or aluminum. When the base 16 is formed from a copper alloy, a thin refractory oxide layer is formed on the surface of the base. Suitable copper alloys for forming the oxide layer in situ contain from about 2% to about 12% by weight aluminum and include copper alloy C638 (aluminum bronze having the nominal composition by weight 2.5–3.1% aluminum, 0.25–0.55% cobalt, 1.5–2.1% silicon and the balance copper) as well as Copper alloy C6381 which contains by weight 2.5–3.1% aluminum, 1.5–2.1% silicon and the balance copper.

Formation of the refractory oxide is accomplished by oxidizing the substrate in a gas having a low oxygen content. The substrate may be placed in a container containing 4% hydrogen, 96% nitrogen and a trace of oxygen. The gas is heated to a temperature between about 330° C. and about 820° C. Dependent on the temperature and amount of time the substrate is in the heated gas, a refractory oxide layer of a desired thickness forms on the surface of the alloy.

Alternatively, a copper alloy which does not form a refractory oxide in situ may be used, such as C197 (nominal composition by weight 0.6% iron, 0.2% phosphorous, 0.05% magnesium and the balance copper). A second material which is capable of forming a refractory oxide such as nickel is coated onto the copper alloy substrate by a process such as electroplating or cladding. The refractory oxide is then formed on the coating such as by heating in a controlled oxygen content atmosphere. This concept is more fully described in U.S. Pat. No. 4,796,083 to Cherukuri et al.

Further, the base 16 can also be aluminum based. Preferred aluminum alloys are identified by the ASM (American Society for Metals) as 3XXX series. These alloys contain up to about 1.5 percent by weight manganese, along with other alloying elements. A most preferred aluminum alloy is aluminum alloy 3003 having a nominal composition by weight of about 0.12% copper, about 1.2% manganese and the balance aluminum. The base is then anodized to form a hydrated aluminum oxide on the surface. One suitable anodization sequence involves anodically immersing the base component in an electrolyte containing an aqueous mixture of sulfuric and sulfosalicylic acid and spiking the amperage to in excess of about 70 amps within the first 3 minutes of anodization. This process is described in more detailed in U.S. Pat. No. 5,066,368 to Pasqualoni et al.

The silicon based device 14 has a coefficient of thermal expansion of about $60 \times 10^{-7}/°$ C. The base 16 has a coefficient of thermal expansion of about $170 \times 10^{-7}/°$ C. when copper or a copper alloy and about $230 \times 10^{-7}/°$ C. when aluminum or an aluminum alloy.

The stresses generated by the thermal expansion mismatch between the silicon and the metallic base would fracture the silicon device if bonded directly to the metallic base 16. To prevent fracture, a buffer 18 is disposed between the base 16 and device 14. The buffer 18 can be any material having a coefficient of thermal expansion close to that of the semiconductor device such as molybdenum, tungsten, and iron-nickel alloys such as (by weight) 42% Ni/ 58% Fe; 36% Ni/64% Fe; and 54% Fe/28% Ni/18% Co. Other metallic buffers are composite materials such as copper clad stainless steel.

The buffer 18 is bonded to the base 16 by any suitable means, such as a metallic braze, solder or a sealing glass. Brazing is the preferred method because the braze provides good thermal conductivity and is stable at the glass sealing temperature of about 350° C. to 450° C. One suitable braze is BT, the silver copper eutectic (28 wt. %Ag /72% wt. %Cu) which melts at 780° C. The buffer 18 and the portion of the base 16 which contacts the braze 20 may be coated with another material to enhance the bond. For example, a molybdenum buffer is frequently coated with nickel.

The semiconductor device 14 is next bonded to the opposite side of the buffer 18 by a die attach 22. The die attach 22 may be any suitable low melting temperature solder such as a gold silicon eutectic or a tin silver solder. Alternatively, a glass or polymer adhesive die attach may be used. The dielectric die attach may be filled with a silver powder for electrical conductivity.

A sealing glass 24 is then deposited around the perimeter of that portion of the base 16 which is to be encapsulated. The sealing glass contacts the metallic base and cover as well as the leadframe. To prevent electrical short circuiting, the glass should be a dielectric. Additionally, the sealing glass 24 is selected to have a coefficient of thermal expansion approximately equal to that of the base 16. Generally, the expansion coefficient of the glass 24 is within about 10% of that of the base component. When the base component 16 is copper or a copper based alloy, suitable sealing glasses include a vitreous glass matrix selected from the group consisting of lead borate, lead-zinc borate, lead borate silicate and lead-zinc borate silicate to which up to about 30 weight percent of particulate additive such as calcium fluoride or barium fluoride is added. The particulate additive may either be uncoated such as disclosed in U.S. Pat. No. 4,752,521 to Smith et al. or coated as disclosed in U.S. Pat. No. 4,185,139 to Smernos. A most preferred glass contains spherical calcium fluoride particles as disclosed in U.S. patent application Ser. No. 812,300, filed Dec. 23, 1991 by O'Donnelly. The use of a spherical particulate filler increases the achievable loading density providing a higher coefficient of thermal expansion and a closer match to the package substrates.

A suitable glass for an aluminum or aluminum alloy base 16 is disclosed in U.S. Pat. No. 4,202,700 to Wilder, Jr. and has the composition about 40 molar percent $Na_2O$, 10 molar percent BaO, 1 molar percent $Al_2O_3$ and 49 percent $P_2O_5$.

The sealing glass is deposited in the desired location such as by screen printing. After screening, the sealing glass is fired at a low temperature to drive off liquids and to fuse the solder glass to the base 16. A leadframe 12 is then embedded in the sealing glass 24. The leadframe 18 has a plurality of leads, the inner lead ends 28 of which approach a central region of the base from one or more sides. Wire bonds 26 electrically interconnect the inner lead ends 28 of the leadframe to the integrated circuit device 14. The bond wires 26 are small diameter, on the order of 0.25 millimeter, gold or aluminum wires.

A cover 30 preferably manufactured from the same material as the base 16 is formed with an oxide coating and a sealing glass 32 deposited. The entire package is then fired at a relatively high temperature, typically on the order of about 350°–400° C. to fuse the sealing glass, bonding the base 16 to the cover 30 with the leadframe 12 disposed therebetween. On cooling, a sealed hermetic package is formed.

When hermetic, the metal package provides improved thermal conduction over a similar ceramic package. However, fractures in the sealing glass 24 may develop as the package is cooled after glass sealing or during subsequent operation. One typical glass fracture failure initiates at the inside corners of the base 16 on the side opposite the leadframe 12 as indicated by reference arrow 34. These fractures may either cause the package to fall apart or lose hermeticity by providing an ingress for contaminants.

Figure 2:
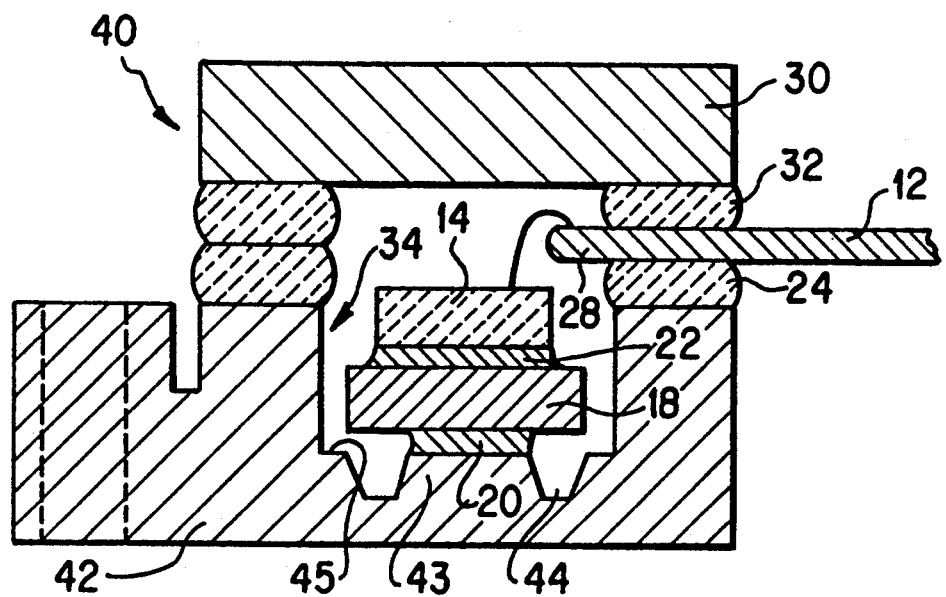
FIG. 2 shows in cross sectional representation a glass-sealed metal electronic package in accordance with the invention.

The applicants have discovered a means to minimize or eliminate fractures initiating at stress concentration point 34. Applicants' package 40 is illustrated in cross sectional representation in FIG. 2. The package has most embodiments similar to those in FIG. 1 and where similar reference numbers are used, the package components are essentially identical. Applicants' base 42 differs from the prior art base 16 in the inclusion of a pedestal 43 disposed in the central region defined by the inner lead ends 28 of the leadframe 12. The buffer 18 is bonded to the pedestal 43 with at least a portion of the buffer 18 overhanging the pedestal 43. Because the cross sectional area of the pedestal 43 is less than the cross sectional area of the buffer 18, the area of braze 20 is reduced. This reduced braze area lessens the constrictive effect of the buffer on the coefficient of thermal expansion of the base 42. The base 42 expands and contracts more uniformly in response to the addition or removal of heat. Since the size of the buffer 18 has not been reduced, the area available for bonding an integrated circuit 14 is not reduced. Larger devices 14 may be encapsulated in the package without the generation of increased stresses at fracture point 34.

One method of forming the pedestal 43 is to machine or otherwise form a continuous recessed channel 44 in the base such that the pedestal is at about the same height as that portion 45 of the base 42 adjacent the recessed channel 44. The reduced thickness of the base 42 at the area of the recessed channel 44 provides a degree of strain relief. The strain due to thermal expansion mismatch is accommodated by plastic deformation of the metallic base 42 beneath the reduced thickness area.

Thermal conduction of heat generated during the operation of the integrated circuit device 14 is primarily through the pedestal 43. As the surface area of the pedestal 43 is decreased, thermal conduction also decreases. To maintain good thermal conductivity, the cross sectional area of the pedestal 43 at the braze 20 should be at least about 50% the cross sectional area of the buffer 18 and preferably from about 60% to about 90% of the cross sectional area of the buffer 18. Most preferably, the cross sectional area of the pedestal 43 should be from about 75% to about 85% the cross sectional area of the buffer.

The depth of the recessed channel 44 should not unduly reduce the strength of the base 42 such that the base flexes. Preferably, the maximum depth of the recessed channel is 50% of the thickness of the base region 45 adjacent the recessed channel. More preferably, the recess channel depth is about 20% to about 40% the thickness of the adjacent base region.

The advantages of a package base having a pedestal 43 as claimed by applicants will become more apparent from the Example which follows:

EXAMPLE

A nickel plated copper alloy C197 base having a length of 16.1 mm (0.636 inch) and a width of 9.93 mm (0.391 inch) formed with a 5.2 mm (0.205 inch) by 4.4 mm (0.175 inch) cavity with a depth of 0.5 mm (0.020 inches). A nickel clad molybdenum buffer having a length of 4.1 mm (0.16 inches) and a width of 4.8 mm (0.19 inches) was brazed to the cavity base. The thickness of the molybdenum buffer varied as indicated in Table 1. Some of the molybdenum buffers were brazed directly to the cavity base, while others were brazed to a pedestal. When a pedestal was present, the width of the recessed cavity 44 was 0.76 mm (0.03 inches). The cross sectional area of the pedestal was equal to 68.4% of the cross sectional area of the buffer.

A nickel plated copper alloy C197 cover was bonded to the base with a leadframe disposed therebetween, using a non-spherical calcium fluoride filled solder glass as described above. The assembled packages were then thermally shocked in accordance with Military Standard 883C, test condition C which involves immersing the package in a first inert fluid at a temperature of 150° C. for a time of at least five minutes. The package is then immersed in a second inert fluid at a temperature of −65° C. also for at least five minutes. The dwell time between the elevated temperature exposure and low temperature exposure is less than 10 seconds. This thermal cycle is repeated 15 times. Packages were then evaluated for gross leak by immersion in a hot inert fluid and visual observation for a stream of vapor bubbles and for fine leaks by use of a helium tracer gas as known in the art.

As shown in Table 1, reducing the thickness of the molybdenum buffer was ineffective to reduce the failure rate while use of a pedestal for bonding was highly successful.

TABLE 1

| Buffer Thickness (millimeters) | Failure Rate (percent) |
|---|---|
| 0.38 | 75 |
| 0.25 | 60 |
| 0.13 | 40 |
| 0.38 bonded to a pedestal representing 68% of cross sectional area of the buffer | 0 |

The patents and patent applications sent forth in this application are intended to be incorporated herein by reference.

It is apparent that there has been provided in accordance with this invention, a glass sealed metal electronic package which minimizes fracture of the sealing glass and fully satisfies the objects, means and advantages set forth hereinbefore. While the invention has been described in combination with specific embodiments and examples thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. An electronic package assembly, comprising:
   a leadframe having a plurality of leads, the inner ends of which define a central region;
   a base containing a recessed channel defining a pedestal disposed adjacent said central region, said recessed channel having a depth of up to 50% the depth of that portion of said base adjacent said recessed channel;
   a buffer bonded to said pedestal with a portion of said buffer overhanging said pedestal; and
   a sealing glass bonding said base to said leadframe.

2. The electronic package assembly of claim 1 wherein said pedestal is defined by a continuous recessed channel in said base.

3. The electronic package assembly of claim 2 wherein said pedestal has a cross sectional area of from about 60% to about 90% the cross sectional area of said buffer.

4. The electronic package assembly of claim 3 wherein said pedestal has a cross sectional area of from about 70% to about 80% the cross sectional area of said buffer.

5. The electronic package assembly of claim 3 wherein said recessed channel has a depth of from about 20% to about 40% the thickness of said adjacent base region.

6. An electronic package assembly, comprising:
   a leadframe having a plurality of leads, the inner ends of which define a central region;
   a metallic base containing a recessed channel forming a pedestal disposed within said central region, said recessed channel having a depth of up to 50% the depth of that portion of said base adjacent said recessed channel;
   a buffer brazed to said pedestal with a portion of said buffer overhanging said pedestal; and
   a sealing glass bonding said base to said leadframe.

7. The electronic package assembly of claim 6 wherein said pedestal has a cross sectional area of from about 60% to about 90% the cross sectional area of said buffer.

8. The electronic package assembly of claim 7 wherein said bases formed from copper, aluminum, or alloys thereof.

9. The electronic package assembly of claim 8 wherein said base is formed from a nickel plated copper alloy.

10. The electronic package assembly of claim 9 said base is formed from either copper alloy C197.

11. The electronic package assembly of claim 8 wherein said base is formed from an aluminum alloy and coated with an anodization layer in at least those portions of said base which either are exposed to the outside environment or contact said sealing glass.

12. The electronic package assembly of claim 11 wherein said base is formed from aluminum alloy 3003 and said anodization layer is an integral black color.

* * * * *